United States Patent
Suntola et al.

(10) Patent No.: US 6,630,030 B1
(45) Date of Patent: Oct. 7, 2003

(54) METHOD AND APPARATUS FOR GROWING THIN FILMS

(75) Inventors: Tuomo Suntola, Espoo (FI); Pekka Soininen, Helsinki (FI); Niklas Bondestam, Helsinki (FI)

(73) Assignee: ASM Microchemistry Ltd., Espoo (FI)

( * ) Notice: Subject to any disclaimer, the term of this patent is extended or adjusted under 35 U.S.C. 154(b) by 0 days.

(21) Appl. No.: 09/686,613

(22) Filed: Jan. 4, 2000

Related U.S. Application Data

(63) Continuation-in-part of application No. PCT/FI98/00571, filed on Jul. 3, 1998.

(30) Foreign Application Priority Data

Jul. 4, 1997 (FI) .................................................. 972874

(51) Int. Cl.$^7$ .............................................. C23C 16/00
(52) U.S. Cl. ...................... 118/728; 118/715; 118/729; 118/733
(58) Field of Search .............................. 118/715, 719, 118/728, 729, 733

(56) References Cited

U.S. PATENT DOCUMENTS

| | | | |
|---|---|---|---|
| 3,854,443 A | | 12/1974 | Baerg |
| 4,522,149 A | * | 6/1985 | Garbis et al. ............... 118/725 |
| 4,582,720 A | * | 4/1986 | Yamazaki .................. 427/573 |
| 4,694,779 A | * | 9/1987 | Hammond .................. 118/730 |
| 5,500,256 A | * | 3/1996 | Watabe ........................ 427/579 |
| 5,551,982 A | * | 9/1996 | Anderson et al. ............. 118/715 |
| 5,595,606 A | * | 1/1997 | Fujikawa et al. ............ 118/725 |
| 5,674,320 A | * | 10/1997 | Kordina ........................ 118/715 |
| 5,711,811 A | * | 1/1998 | Suntola ........................ 118/711 |
| 6,042,652 A | * | 3/2000 | Hyun ........................... 118/719 |

FOREIGN PATENT DOCUMENTS

| | | | |
|---|---|---|---|
| EP | 0 015390 | | 9/1980 |
| EP | 0550 058 A2 | | 7/1993 |
| JP | 61-101020 | * | 5/1986 |
| JP | 61-263118 | * | 11/1986 |
| JP | 62-080271 | * | 4/1987 |
| JP | 02-030119 | * | 1/1990 |
| WO | WO 96/17106 | | 6/1996 |
| WO | WO 96/17969 | * | 6/1996 |

* cited by examiner

Primary Examiner—Richard Bueker
(74) Attorney, Agent, or Firm—Knobbe, Martens, Olson & Bear, LLP.

(57) ABSTRACT

A method and an apparatus for producing a thin film on a substrate. A substrate is placed in a reaction space and is subjected to alternately repeated surface reactions with at least two different reactants. The reactants are fed in the vapor phase repeatedly and alternately into the reaction space through tree-like piping having a plurality of channels and nozzle orifices, where the nozzle orifices are arranged in a plane perpendicular to the plane of the substrate. The apparatus includes a reaction chamber in which the substrate is placed, inflow piping having a plurality of channels and nozzle orifices, and outlet passages for removing the reaction products and excess reactants. The inflow piping has a tree-like shape and is contained in a plurality of interconnected plates. The nozzle orifices are arranged in an essentially planar fashion in a plane essentially perpendicular to the plane of the substrate.

12 Claims, 8 Drawing Sheets

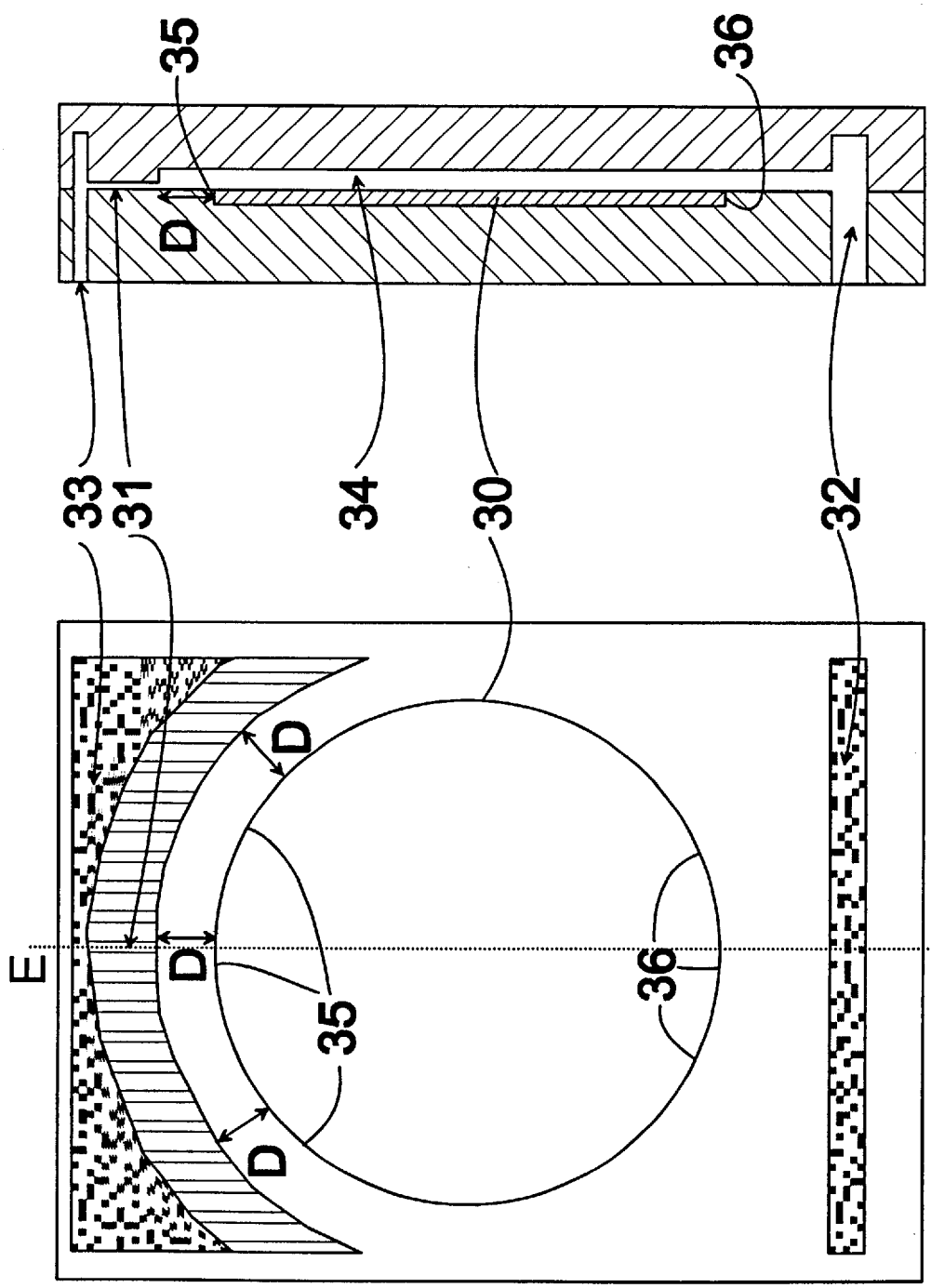

METHOD AND APPARATUS FOR GROWING THIN FILMS

This is a continuation-in-part under 35 U.S.C. §120 of International Application PCT/FI98/00571, with an international filing date of Jul. 3, 1998.

The present invention relates to a method according to the preamble of claim 1 for producing thin films.

In the present method, a substrate located in a reaction space is subjected to alternately repeated surface reactions of at least two different reactants used for producing a thin film. The vapor-phase reactants are admitted repetitively and alternately each reactant from its own source into the reaction space where they are allowed to react with the substrate surface for the purpose of forming a solid-state thin film product on the substrate. Reaction products which have not adhered onto the substrate and any possible excess reactant are removed from the reaction space in vapor phase.

The invention also concerns an apparatus according to the preamble of claim 8.

Conventionally, thin-films are grown using vacuum evaporation deposition, the Molecular Beam Epitaxy (MBE) and other corresponding vacuum deposition methods, different variants of the Chemical Vapor Deposition (CVD) method (including low-pressure and organometallic CVD and plasma-enhanced CVD), or alternatively, the above-described deposition method of alternately repeated surface reactions called the Atomic Layer Epitaxy (ALE) method. In the MBE and CVD methods, besides other process variables, the thin-film growth rate is also affected by the concentrations of the starting material inflows. To achieve a uniform thickness of the layers deposited by the first category of conventional methods, the concentrations and reactivities of the starting materials must be kept equal all over the substrate area. If the different starting materials are allowed to mix with each other prior to reaching the substrate surface as is the case in the CVD method, for instance, the risk of their mutual reaction arises. Then, the risk of microparticle formation already in the inflow channels for the gaseous reactants is imminent.

Such microparticles usually have a deteriorating effect on the quality of the thin film. Therefore, the possibility of premature reactions in MBE and CVD reactors is avoided by heating the starting materials no earlier than at the substrate surfaces. In addition to heating, the desired reaction can be initiated using, e.g., a plasma or some other similar activator.

In the MBE and CVD processes, the growth of thin films is primarily adjusted by controlling the inflow rates of starting materials impinging on the substrate. By contrast, the ALE process is based on allowing the substrate surface qualities rather than the starting material concentrations or flow properties to control the deposition rate. The only prerequisite in the ALE process is that the starting material is available in sufficient concentration for thin-film formation all over the substrate.

The ALE method is described in, e.g., FI Patent Specifications Nos. 52359, 97730 and 57975, in WO Publication No. 96/17107 and in U.S. Pat. Nos. 4,058,430 and 4,389,973, in which also some apparatus embodiments suited for implementing this method are disclosed. Apparatus constructions for growing thin films can also be found in the following publications: Material Science Report 4(7) (1989), p. 261, and Tyhjiötekniikka (Finnish publication for vacuum techniques), ISBN 951-794-422-5, pp. 253–261.

In the ALE deposition method, atoms or molecules are arranged to sweep over the substrates thus continuously impinging on their surface so that a fully saturated molecular layer is formed thereon. According to the conventional techniques known from FI Patent Specification No. 57975, the saturation step is followed by an inert gas pulse forming a diffusion barrier which sweeps away the excess starting material and the gaseous reaction products from the substrate. The successive pulses of different starting materials and of diffusion barriers of carrier gas, the latter separating the former, accomplish the growth of the thin film at a rate controlled by the surface chemistry properties of the different materials. Such reactor is called the "traveling-wave" reactor. To the function of the process it is irrelevant whether it is the gases or the substrates which are moved, but rather, it is imperative that the different starting materials of the successive reaction steps are separated from each other and arranged to impinge on the substrate alternately.

Most vacuum evaporators operate on the so-called "single-shot" principle. Hereby, a vaporized atom or molecule can impinge on the substrate only once. If no reaction with the substrate surface occurs, it is rebound or re-vaporized so as to hit the apparatus walls or the vacuum pump undergoing condensation therein. In hot-walled reactors, an atom or molecule impinging on the reactor wall or the substrate may become re-vaporized and thus repeatedly impinge on the substrate. When applied to ALE reactors, this "multi-shot" principle can provide, i.a., improved efficiency of material consumption.

If the starting materials in ALE deposition, due to flow dynamic or other reasons, are unevenly distributed over different parts of the substrates, it is necessary to pulse each starting material over the substrates in an amount which will guarantee that even at the thinnest flow, a sufficient amount flows at each pulse in order to ensure an even growth of the film. Knowing, on the other hand, that flow geometry can lead to concentration differences of even several decades, it may in the case of a disadvantageous flow geometry be necessary to pulse greater amounts of starting materials than the growth of the film in its entirety would presuppose. This is termed overdosage and other reasons may also exert an influence here, such as the chemistry of the starting materials.

In order for a sufficient amount of starting material to be provided over different parts of the substrate without any significant overdosage, two solutions are applied to achieve an even distribution of the gases:

1. The apparatus is constructed such that the pressure on the substrates is so low that the average mutual collision distance of the gas molecules is greater than the distances between the substrates. Hereby most of the collisions of the gas molecules will hit the substrates and few gases are evenly distributed with regard to the substrates. When the average collision distance is equal to the distance d between walls in a typical system or at least one hundredth part thereof, the gas is called transitional. At a pressure of one millibar and at room temperature the collision distance of one nitrogen molecule is 64 micrometers and at 0.01 mbar, 6.4 mm. In ALE reactors the distances between the substrates are typically in the range of a few millimeters. Thus, when the discussed solution is sought, the pressure must be about 1 mbar or preferably even lower.

2. At a greater pressure the average collision distance of the gas molecules is diminished and the gas is no longer transitional but is instead in a viscous state (collision interval<d/100). In viscous state the flow of the gas is collective movement of its molecules, linked together via the collisions, towards the decreasing pressure. The intermixing of the molecules caused by the thermal movement is expressed as diffusion. In these solutions the aim is to distribute gas evenly over the substrates by means of different gas flow generators and nozzles because the diffusion velocities in the cross direction of the gas flow are small compared to the speed of propagation of the gas.

The problem with the first alternative is the low pressure required in the case of real dimensions. When the pressure decreases by a decade, the pump capacity must also be increased by a decade and the gas velocities are also increased by a decade if the gas flow is kept constant.

The gas velocities cannot surpass acoustic velocity and the pump prices are drastically increased. In addition, with the decreasing pressure the dimensions of the reactor must be enlarged in order to achieve improved transmittance such that pressure losses increasing the pressure are prevented. This would again presuppose that the pressure be reduced.

The pressure can also be reduced by reducing the sweep flows and the transmission flows of the starting materials. As there is still the same amount of starting material to be transmitted and sufficient sweeping is required, this will result in prolonged process times. This does not necessarily pose a problem is research reactors but the problem will be accentuated in production apparatuses and in the case of large substrate surface areas.

In the solution according to the second alternative the pressure is typically 2 to 10 mbar whereby the pumps needed are of moderate size, the dimensions of the piping and the substrate holder easy to implement and the flow times and rates of the gases reasonable.

When gases are distributed evenly over the entire breadth of the substrates, different kinds of collision causers and pressure reducing devices or throttles are used. In collision causers the gas jet is made to impinge on a surface which causes diffusion and mixing of the jet. It is also possible to arrange several successive collisions like this. The function of the gas throttles, then, is based on the fact that on the entering side of parallel throttles there is great conductance compared to the conductance through the throttles. Thus, for the gas all throttles are equivalent and the flow is evenly distributed into linear or planar form. As throttles, e.g. a narrow slit, adjacent holes (pipes), sinter, or the like, may be used.

Even though an even flow has been achieved, in practice there have been problems with the evenness of the film because viscous gases are directed towards the lower pressure, i.e. towards the gas exhaust port.

A solution to this problem has been described in FI Patent Specification No. 97731. In the solution according to the patent the evacuation of gas is regulated by controlling the throttle at the exhaust end. The method is functional when the channels at the feed end are large and dynamic factors caused by intense "gas jets" cannot affect the distribution. Therefore, in spite of an even suction at the exhaust end even the infeed flows have been flattened, thereby seeking to assist the distribution of the gas mixture.

The evenness of the exhaust suction has been achieved such that the conductance of the exhaust duct is, for example, 10 to 100 times the conductance of the exhaust slits. In some known solutions the slit between the substrates functions as a throttle dividing the flows. Thus, the gas flow distribution can be influenced by the relation between the exhaust duct conductance and the exhaust slit conductance. Once the gases have passed the exhaust slit their possible intermixing is no longer of any great significance, and thus, the conductance of the exhaust duct can be increased by increasing the dimensions of the exhaust duct. Another alternative for achieving a sufficiently good conductance ratio would be to reduce the conductance of the exhaust slits. The problem would be posed, however, of increased pressure in the reactor and also in the delivery piping.

As regards the input side, then, the gas flow rate, the sweepability of the channels and pressure losses play a major role. If the conductance ratio is controlled by choking the feed slits, the pressure in the feed channel will rise, causing the lowest possible pressure at a solid (or liquid, gas) source to rise. This, then, presupposes that the source temperature be raised in order to raise the vapor pressure (if possible), which in turn may have a negative effect on the starting material. (E.g. the efficiency of the source (magnitude of supplied starting material pulse as compared to the amount of carried gas supplied) is dependent on the ratio between the pressure in the starting material vessel and the vapor pressure of the source material at the temperature in question. With an increasing pressure the collisions between the molecules are increased which for some starting materials will lead to decomposition). With an increased pressure a denser gas results, and thus the flow rates in the piping may be reduced to a harmfully low level. The conductance ratio may also be affected by increasing the size of the feed channels. This will reduce the flow rates and a slow reactor results.

In the construction according to the invention the delivery piping is constructed of pipings branched in a tree-like manner. Modeling software has been developed for calculating the piping and can be used to dimension the piping such that gases are evenly distributed even at a small conductance ratio, whereby the pack can be designed rapid, causing only small pressure loss such that there is little variation of the gas velocity in the feed channels (i.e. the different parts are well swept, the starting material is not unnecessarily hammered by accelerations and decelerations).

In previous constructions (where the choking is taken care of by other means than the slit between the glasses) the substrate was placed in a recess provided in a plate parallel with the substrate. Hereby part of the delivery and exhaust piping is provided in the plate per each substrate or pair of substrates. With an increased number of substrates also the number of these plates which are larger than the substrate is correspondingly increased. The problem here is that the price and weight of the pack are increased in direct proportion when the number of substrates in increased. (The plate is about 10 to 15 cm longer and about 5 to 10 cm broader than the substrate and it must be machined with very strict tolerances. As the material, for instance titanium has been used, whereby the mass of this plate supporting the substrate is great in relation to e.g. the weight of glass or Si wafer substrates). The great weight also increases masses which are slowly heated in vacuum. The known structure is compact and in the construction the pack can be constructed with few parts but with increasing numbers of substrates the afore-cited problems become considerable.

In the construction according to the invention a separate gas supply unit is constructed for feeding the gases. It could be assembled of pipes but is most advantageously formed of sheets into which gas slits are machined. The sheets are placed transversely with regard to the substrates. Hereby a system of gas supply channels is formed in the sheets whose surface area is slightly greater than the cross-section of the pack.

It is an object of the present invention to overcome the drawbacks of conventional technology and to provide an entirely novel method and apparatus for growing thin films of homogeneous quality.

The invention is based on the notion of constructing a tree-like inflow manifold and the plane of the feed slits is preferably essentially perpendicular to the plane of the substrates.

The method of the invention can be advantageously implemented in an apparatus having a pyramid-like cassette structure which can be pulled out of the reaction space in its entirety or, alternatively, one pair of substrates, one pyramid or V structure at a time.

More specifically, the method according to the invention is principally characterized by what is stated in the characterizing part of claim 1.

Furthermore, the apparatus according to the invention is characterized by what is stated in the characterizing part of claim 8.

In the context of the present invention, the term "reactant" refers to a vaporizable material capable of reacting with the substrate surface. In the ALE method, reactants belonging to two different groups are conventionally employed. The reactants may be solids, liquids or gases. The term "metallic reactants" is used of metallic compounds or even elemental metals. Suitable metallic reactants are the halogenides of metals including chlorides and bromides, for instance, and organo-metallic compounds such as the thd complex compounds. As examples of metallic reactants Zn, $ZnCl_2$, $Ca(thd)_2$, $(CH_3)_3Al$ and $Cp_2Mg$ may be mentioned. The term "nonmetallic reactants" is used for compounds and elements capable of reacting with metallic compounds. The latter group is typically represented by water, sulphur, hydrogen sulphide and ammonia.

In the present context, the term "carrier" gas is used to refer to a gas which is admitted into the reaction space and is capable of preventing undesired reactions related to the reactants and, correspondingly, the substrate. Such reactions include e.g. the reactions of the reactants and the substrate with possible impurities. The carrier gas also serves to prevent reactions between substances of different reactant groups in, e.g., the inflow piping. In the method according to the invention, the carrier gas is also advantageously used as the carrier gas of the vapor-phase pulses of the reactants. According to a preferred embodiment, in which reactants of different reactant groups are admitted via separate inlet manifolds into the reaction space, the vapor-phase reactant pulse is admitted from one inflow channel while the carrier gas is admitted from another inflow channel thus preventing admitted reactant from entering the inflow channel of another reactant. Of carrier gases suited for use in the method, reference can be made to carrier gases such as nitrogen gas and noble gases, e.g., argon. The carrier gas may also be an inherently reactive gas such as hydrogen gas serving to prevent undesirable reactions (e.g., oxidization reactions) from occuring on the substrate surface.

According to the invention, the term "reaction space" includes both the space in which the substrate is located and in which the vapor-phase reactants are allowed to react with the substrate in order to grow thin films (namely, the reaction chamber) and the gas inflow/outflow channels communicating immediately with the reaction chamber, said channels serving for admitting the reactants into the reaction chamber (inflow channels) or removing the gaseous reaction products of the thin-film growth process and excess reactants from the reaction chamber (outflow channels). According to the construction of the embodiment, the number of the inflow and outflow channels, respectively, can be varied from one upward. They may also be located at opposite ends of the substrates whereby the outflow orifice corresponding to each reactant group is located at the end of the inflow of the other group, advantageously separated therefrom by means of a tongue (cf. the embodiment of FIG. 3). The gases can be fed onto the substrate alternately from opposite directions. In this manner it is possible to compensate any observed stronger film growth at the inflow end of the substrate. Also the exhaust suction from the outflow channel is arranged in an alternated manner.

Herein, the term "substrate surface" is used to denote that top surface of the substrate onto which the vapor-phase reactant flowing into the reaction chamber first impinges. In practice, said surface, during the first cycle of the thin-film growing process is constituted by the surface of the substrate such as glass, for instance; during the second cycle the surface is constituted by the layer formed during the first cycle and comprising the solid-state reaction product which is deposited by the reaction between the reactants and is adhered to the substrate, etc.

According to the invention the flow over the individual substrates is determined by the flow at the inflow end because a flow of as even a velocity as possible is advantageous particularly due to the dynamic properties of the flowing material.

In order to grow an even film it has been found essential in the solution of the invention that Each reactant group is fed directly into the reaction chamber via a separate inflow channel. Preferably, the reactant is allowed to become mixed and homogenized with a carrier gas flow entering from the inflow channel of another reactant group prior to contacting the reactant with the substrate. The exit ends of the inflow channels of the different reactant groups, later in the text called the reactant "feed orifices", are adapted to exit into the reaction chamber, close to the substrates of the thin film structures. To eliminate the risk of reactant contamination, a carrier gas flow is hereby particularly advantageously driven through that inflow channel or channels which is/are currently not used for feeding a reactant. The reactant feed orifices are arranged on opposite sides with regard to the feed orifices for carrier gas.

The homogenization zone may also be arranged prior to the reaction chamber.

In the reaction zone, the aim is to maintain the homogeneity of the gas flowing through. By constructing a narrow reaction chamber (i.e. such that at the substrates its height is small in relation to its width) no concentration profile is created in the gas flow in the reaction chamber. The reaction chamber enclosing the substrate is particularly advantageously designed to have the chamber walls disposed close to the substrate being processed.

As an alternative to the present invention, the choking can be implemented as a narrow suction slit between the exhaust channel communicating with a negative pressure source (e.g. a vacuum pump) and the reaction chamber. This may be constituted by one continuous slit but also of many small parallel slits preceded by a reaction chamber having a great conductance with regard to the slits.

An apparatus having a cassette-type structure is provided with carrier gas sealing which is implemented such that a suction groove is formed in the surface of the planar elements following their perimeter close to the edges of the plates to collect any leaks. The suction groove is made to communicate with the negative-pressure outflow channel. The purpose of the suction groove is to avoid the access of external contamination into the reaction space and to prevent reactants from leaking outside the reaction space. The isolating seal flow in the suction groove functions optimally if the strongest constriction of the reaction gases takes place at the end of the substrate, close to the outflow channel. It is essential for the operation of the suction groove that the pressure in the suction groove is lower than in the reaction space or outside it.

The parts of the cassette structure are made of a material whose surfaces are inert with regard to the reactants used in ALE deposition. Advantageous materials include glass and similar silicate-based materials as well as different ceramic materials.

The solution according to the invention provides considerable benefits over the previously employed ALE solutions. Thus, because the distribution of the gases onto the substrate surfaces becomes more even, a smaller overdosage becomes possible, resulting in savings in the amounts of starting materials and a shorter process time. The quality of the film is also improved. As a correctly dimensioned tree-like structure can be used to reduce pressure losses, the system pressure at the sources is reduced, which increases the efficiency of the apparatus. An inflow manifold dimensioned in accordance with the invention will also provide a swifter apparatus which in turn results in shorter process times.

The above-described apparatus construction details make it possible to reduce the weight of the reaction space and to minimize the number of components in the system.

The invention and its advantages will emerge in closer detail from the following detailed description and the annexed drawings in which FIG. 1 is a general view of an apparatus having an inflow manifold in accordance with the invention, and FIG. 2 is a more detailed view of the inflow manifold of FIG. 1.

FIG. 11 is a side view of an alternative embodiment of an apparatus is accordance with the present invention.

FIG. 12 is a cross section of the apparatus of FIG. 11 Line EE.

Figure 1:
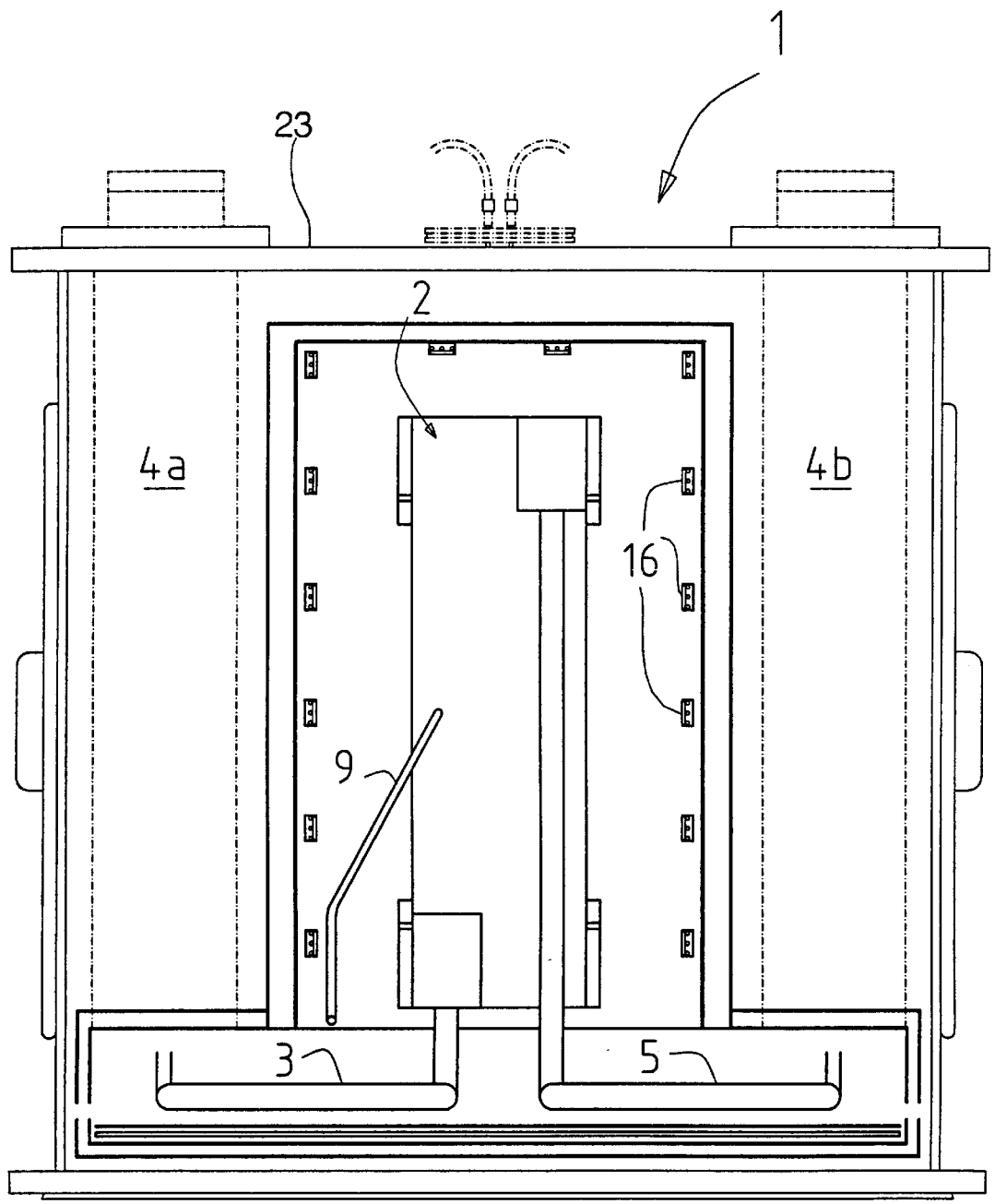

The following terms and reference numerals are used below to refer to the elements:

| | |
|---|---|
| ALE apparatus | 1 |
| Reaction chamber | 2 |
| Inflow piping A | 3 |
| Source group A | 4a |
| Source group B | 4b |
| Inflow piping B | 5 |
| Main inflow channel A | 6a |
| Main inflow channel B | 6b |
| Inflow channel A | 7a |
| Inflow channel B | 7b |
| Main inflow channel for carrier gas | 8 |
| Carrier gas channel | 9 |
| Inflow slits B | 10 |
| Inflow slits A | 11 |
| Slits for carrier gas | 12 |
| Substrate | 13 |
| Substrate holder | 14 |
| Frame for substrate holder | 15 |
| Heating resistor | 16 |
| Flow direction | 17 |
| Suction groove | 18 |
| Main feeder plate | 19 |
| Feeder plate | 20 |
| Slitted plate | 21 |
| Substrate pack | 22 |
| Vacuum envelope | 23 |

| | |
|---|---|
| Silicon wafer | 30 |
| Inflow slits | 31 |
| Outflow channel | 32 |
| Main inflow channel | 33 |
| Reaction chamber | 34 |
| Inflow edge of the wafer | 35 |
| Outflow edge of the wafer | 36 |
| Distance of the inflow slits from the inflow edge of the wafer | D |

In accordance with FIG. 1, the ALE apparatus 1 according to the invention comprises a reaction chamber 2 inside a vacuum envelope 23, the chamber being heated with resistors 16. The apparatus further comprises material sources 4a, inflow piping 3 and second inflow piping 5 from the sources 4b. The apparatus also comprises outflow piping not separately shown in the Figure.

Figure 2:
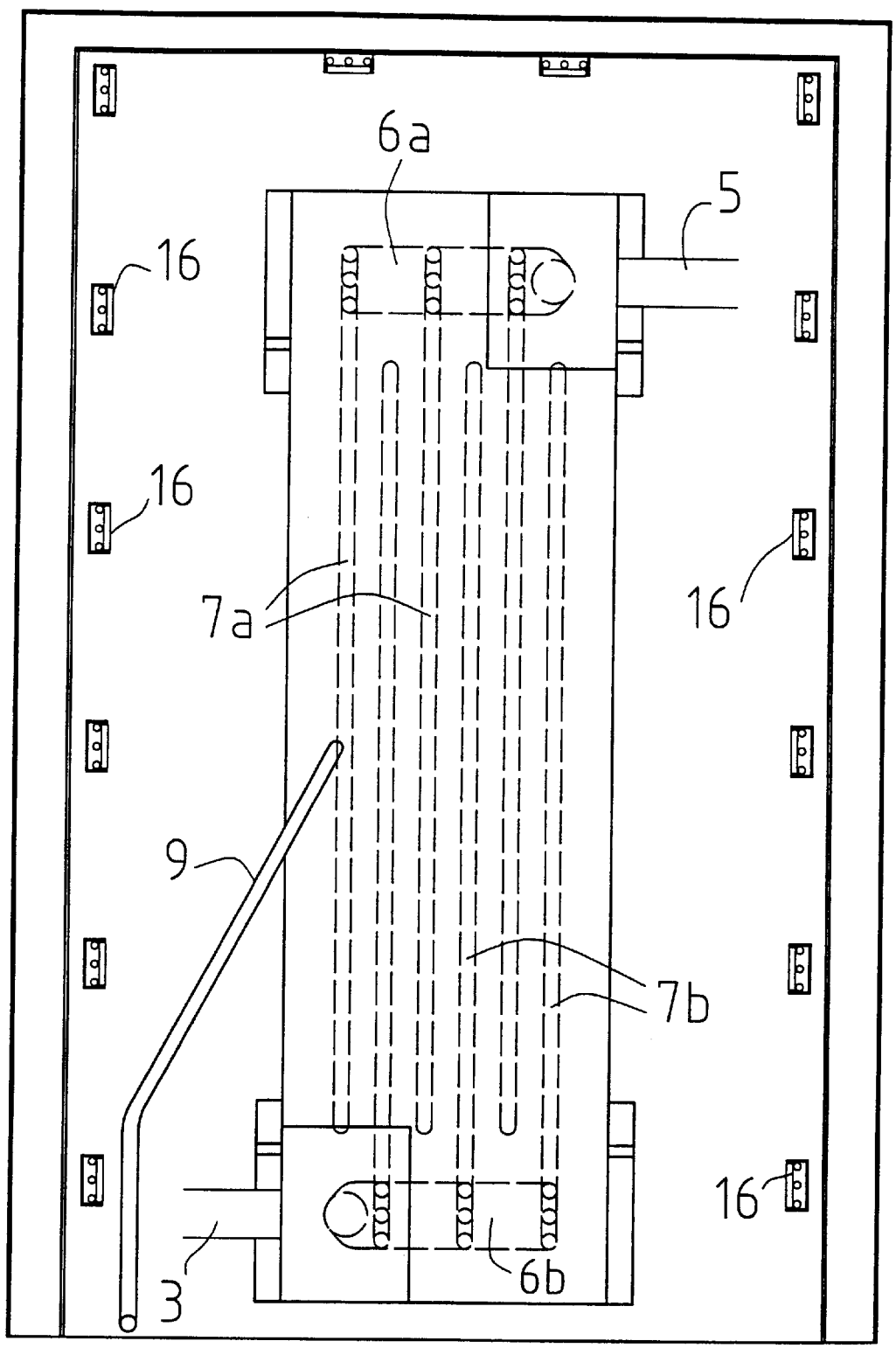

In accordance with FIG. 2, a tree-like inflow piping 3 and 5, comprising main inflow channels 6a and 6b for two source materials, is arranged at one end of the reaction chamber, in this case the top end. In addition, the inflow piping 3 is wherever needed provided with a carrier gas channel 9 for feeding, e.g. nitrogen $N_2$ into the reaction chamber. A suitable process temperature is maintained by means of resistors 16 arranged outside the reaction chamber 2.

Figure 3:
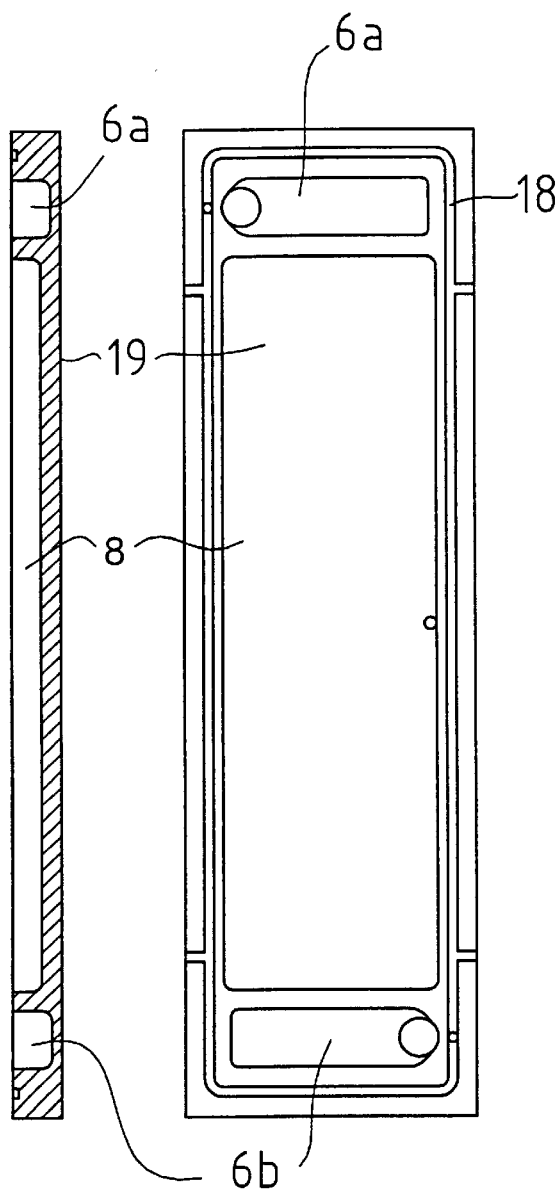
FIG. 3 shows both a sectional and a bottom view of a plate according to the invention constituting the main inflow channel.

In accordance with FIG. 3, main inflow channels 6a and 6b as well as a carrier gas channel 8 and a suction groove 18 are provided in the main feeder plate 19, the suction groove encircling the other inflow channels. The suction groove 18 is provided with a pressure which is lower than that of the vacuum space 23 and the actual reaction chamber 2, whereby all impurities are removed towards the lowest pressure prevailing in the suction groove 18. Alternatively, the suction groove 18 may be arranged to have a positive pressure with regard to the vacuum space 23 and the reaction chamber 2 whereby carrier gas is to be fed into the suction groove 18 at a positive pressure. Hereby the positive pressure reduces the penetration of impurities from the vacuum space 23 into the reaction chamber 2.

Figure 4:
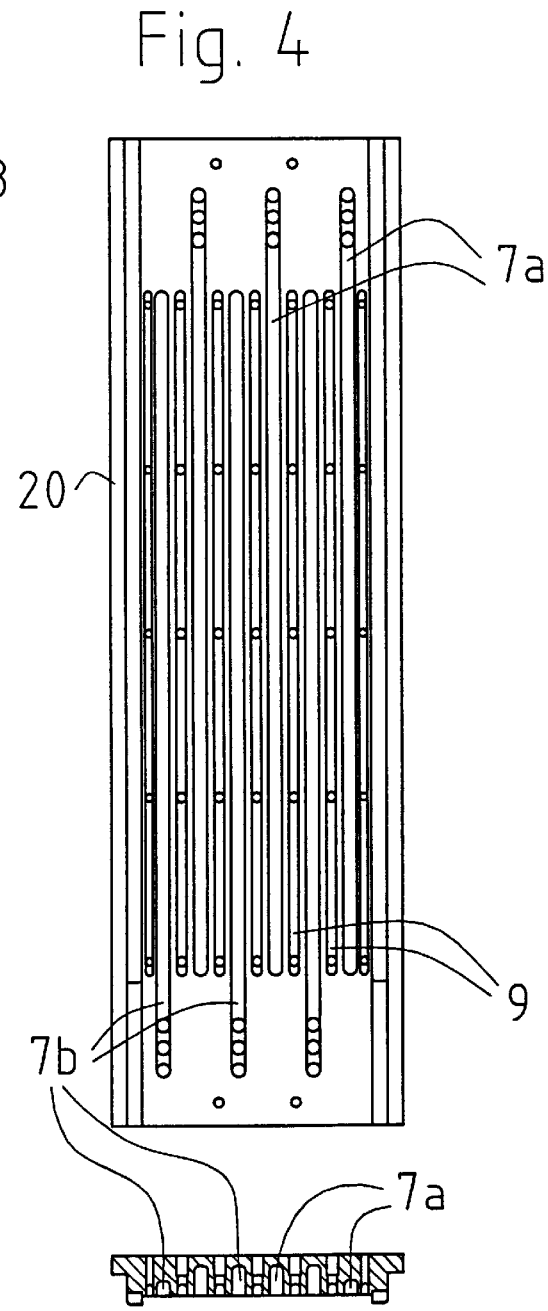
FIG. 4 shows both a bottom and a sectional view of a plate according to the invention providing the inflow channels.

The feeder plate 20 of FIG. 4 is connected to the main feeder plate 19 whereby the main inflow channels diverge into the inflow channels 7a and 7b in a tree-like manner. The flow in the inflow channels 7a and 7b is controlled by means of the shape and area of the channel cross-sections such that, in order to achieve an even flow, the cross-section of the inflow channel 7a and 7b is reduced from the source 4a towards the nozzle orifices.

Figure 5:
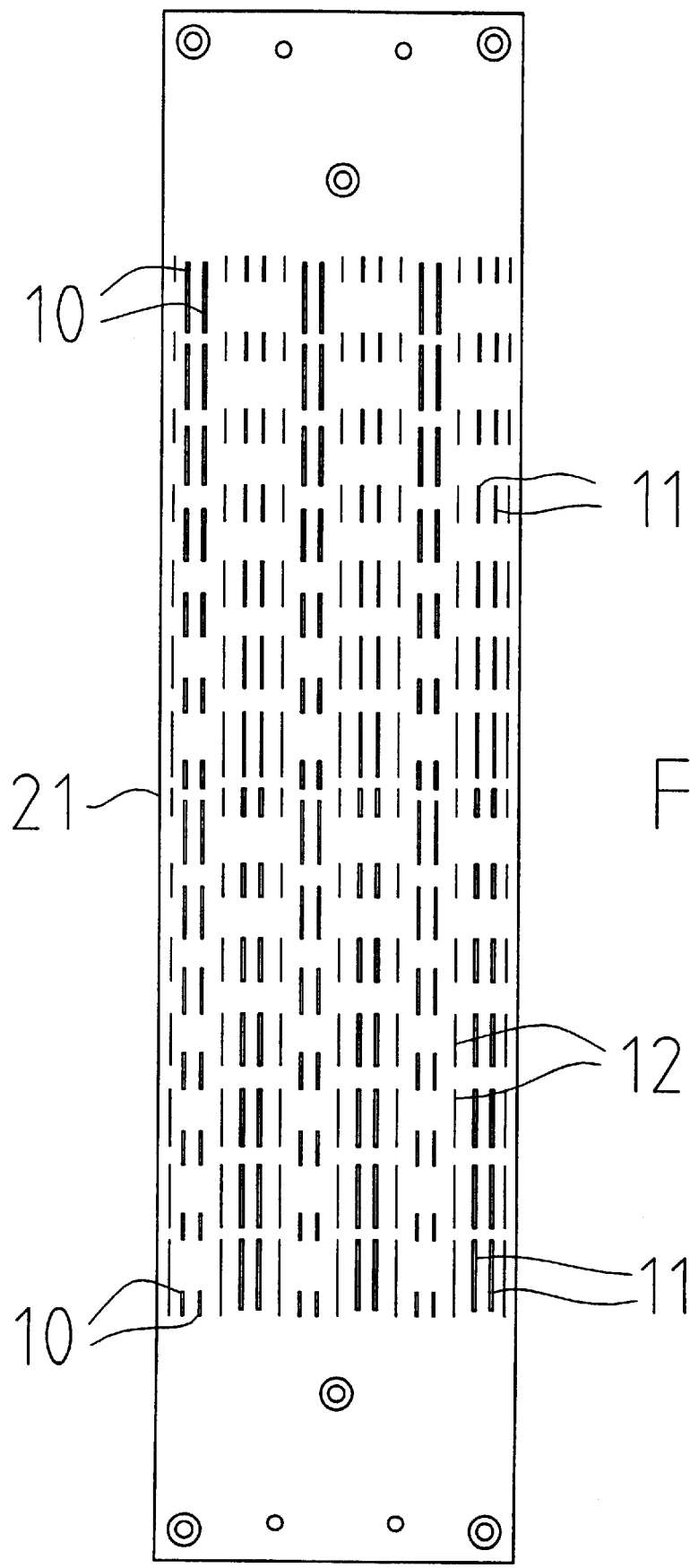
FIG. 5 is a bottom view of a nozzle plate according to the invention.

The slitted plate 21 of FIG. 5 divides the inflow channels into inflow slits 10 and 11 for different feed materials and the carrier gas is fed into the reaction chamber through the slits 12. In order to maintain an even flow, the area of the slits 10 and 11 is typically the greater the farther from the source the slit is situated. The slits 10 and 11 can also be combined to form a continuous slit the length of the entire reaction chamber, whereby the shape of the slit can further be used to control the flow.

Figure 6:
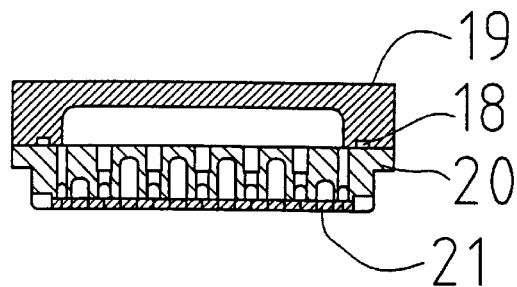
FIG. 6 depicts a cross-section at the inflow channels of the inflow manifold according to the invention.

FIG. 6 depicts the plate structure 19, 20 and 21 as an assembled structure. The position of the suction grooves 18 is particularly clear from this figure.

Figure 7:
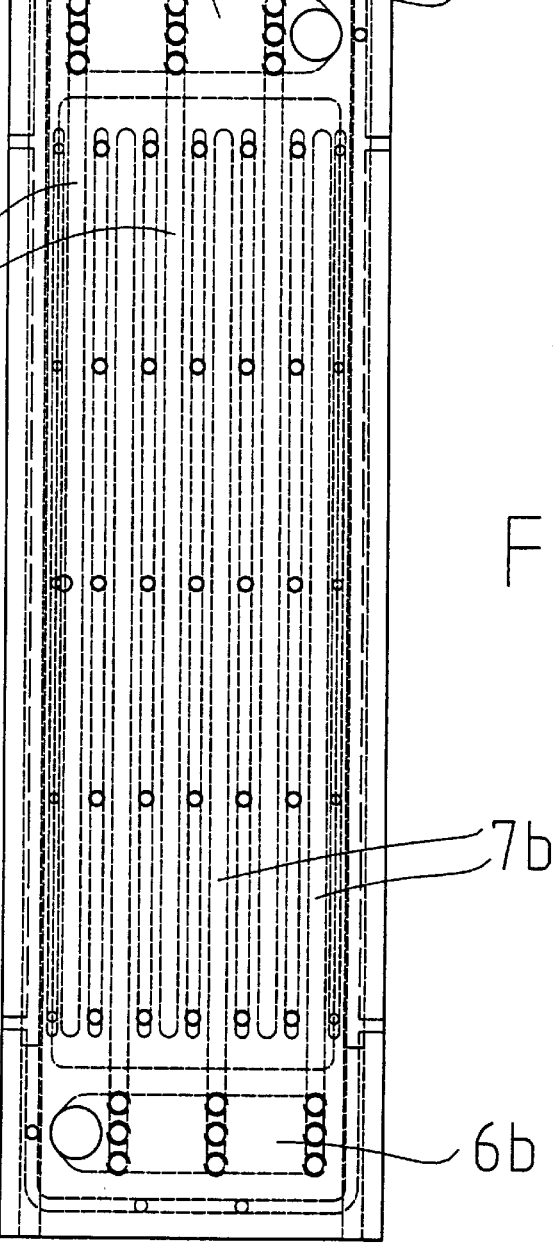
FIG. 7 is a top view of the planar construction of FIG. 6.

FIG. 7 is a top view of the structure of FIG. 6, depicted with broken lines.

Figure 8:
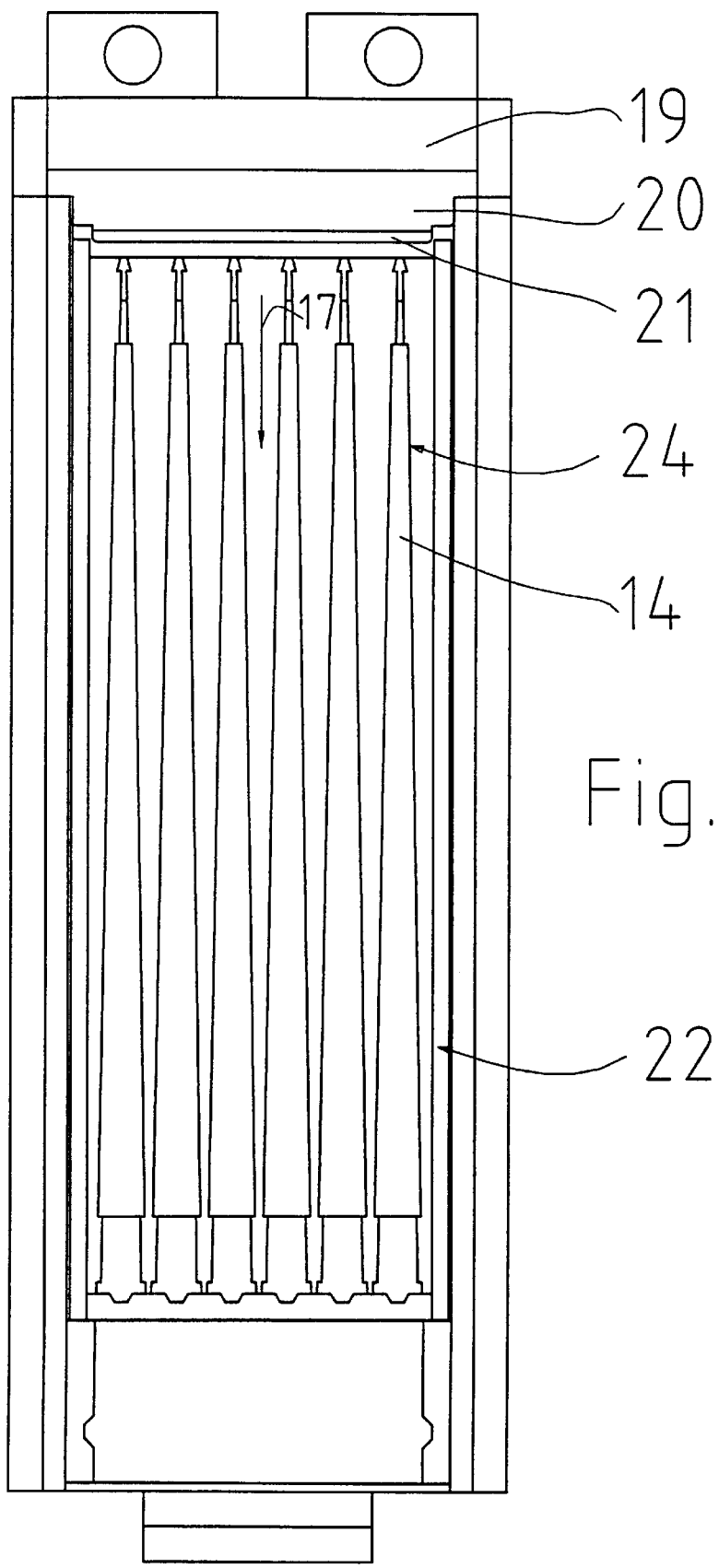
FIG. 8 is an end view of a system for supporting the substrates according to the invention.

FIG. 8 for its part depicts the structure of the substrate pack 22 seen from the direction of the substrate ends. The substrate holders 14 support two substrates in a "pyramidal" position. The angle between the substrates is approximately 2° but may vary between 1 and 10°. Thus, the substrates are arranged essentially perpendicularly to the plates 19, 20 and 21 forming the infeed manifold. In this case the flow is directed 17 downwards in accordance with the coordinates of the Figure. Instead of the "pyramidal" structure the substrates may also be supported in V-form in the manner of "hanging file folders". The angle between the substrates is here essentially the same as in the "pyramidal" solution.

Figure 9:
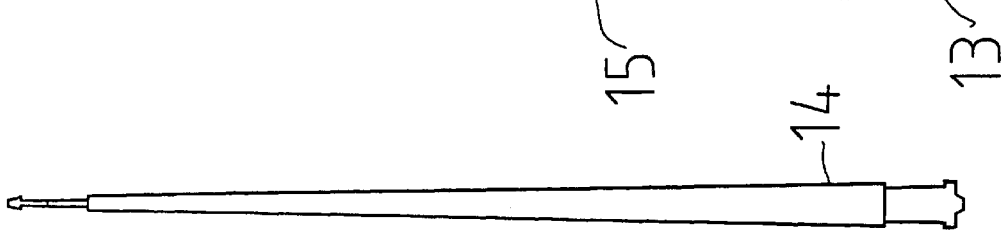
FIG. 9 is an end view of one of the supporting elements of FIG. 8.

In accordance with FIG. 9, an individual substrate holder can be removed from the pack either separately or alternatively together with the entire pack 22. The substrate holders 14 can be connected to each other to form an accordion-like whole, whereby the pack can be easily opened for further treatment of the substrates.

Figure 10:
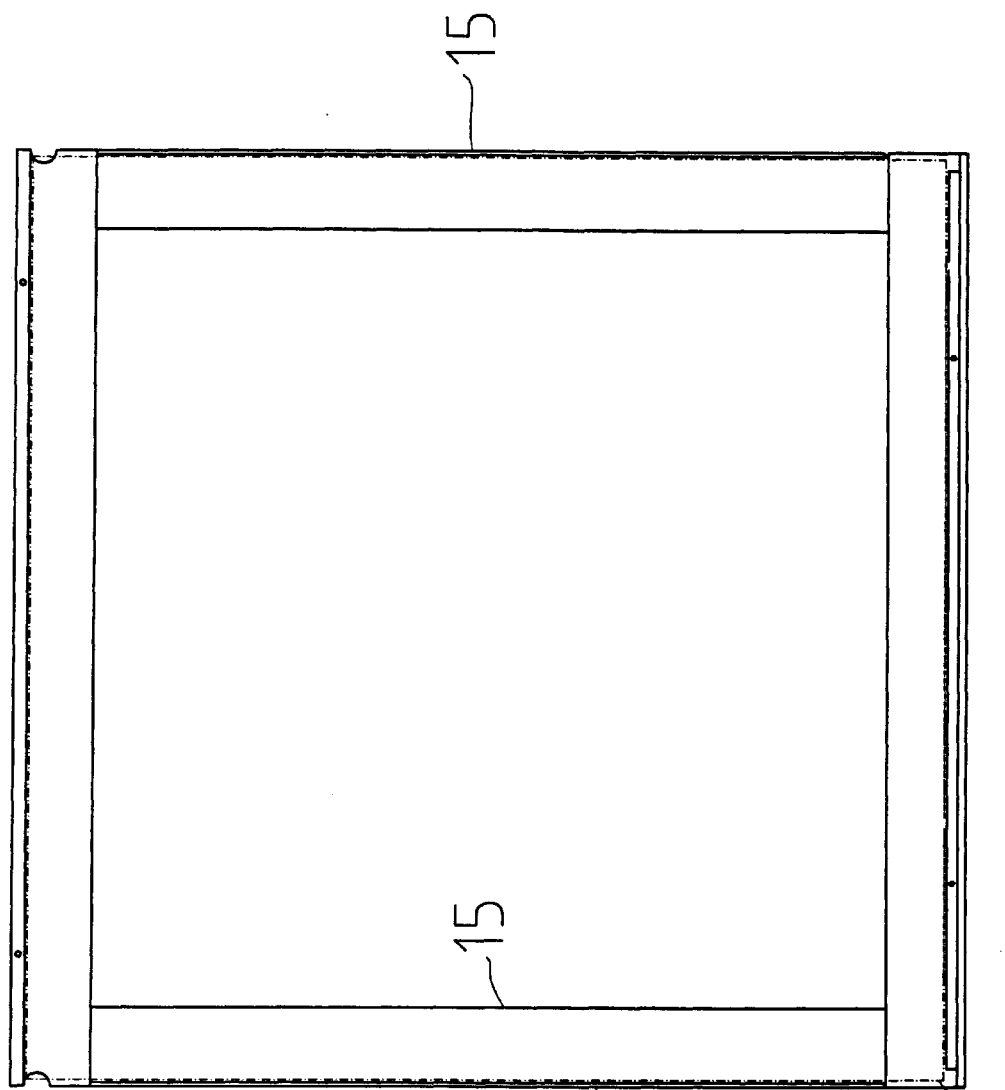
FIG. 10 is a side view of the element of FIG. 9.

As shown in FIG. 10, the substrate 13 is surrounded by a frame 15.

The size of the plates 19, 20 and 21 in the case of, e.g. a pack of 10 350×350 mm substrates is approximately 150×500 mm. 1 or several plates are required and smaller plates may be connected thereto to cover the flow openings. Lighter structures may be used to support the actual substrates 13 in accordance with FIGS. 8 to 10. Thus, the number and size of precisely machined parts are reduced. Furthermore, it is not necessary to dismantle the structure when replacing the substrates 13. The pack 22 can then be dismantled by pulling the substrates 13 from the pack rather like a hanging file folder from the filing cabinet. Whether the substrates are fastened in a suspended or a supported manner, they are simpler to charge into and remove from this type of structure than has been true for any previous solution.

Thus, according to the invention the inflow piping 3 has a tree-like structure such that the main inflow channels 6a and 6b (the trunk of the tree) are provided between two plates 19 and 20 and branch into the inflow channels 7a and 7b for one or more slits between the substrates (the branches). From here, the gas flow is divided into each slit between the substrates by means of parallel slits 10 and 11 (the leaves). The last-mentioned slits 10 and 11 may also be connected, forming one continuous slit whose dimensions may vary at different parts of the slit. A modeling program is used to specify such dimensions of the slits and inflow channels that the desired pressure losses, speeds and speed fluctuations are attained. The aim is to provide an identical material flow from each slit 10 and 11. In order to eliminate the effect of flow dynamic factors and tolerance variations inside the pack part of the structural components have been constructed such that their dimensions are easy to change in order to control the flow distribution. The dimensions of the sides of the channel cross-sections are typically in the range of 2 to 20 mm. The slit is in the range of 0.1 to 2 and its depth 0.5 to 20 mm.

Separate inflow channels 7a and 7b are provided for both groups of starting materials in order to prevent any film growth before the substrates. If need be, the separation of gases in the vicinity of the inflow slits can be enhanced by constructing a similar gas supply system 9 for nitrogen. Nitrogen supply is, however, not always required. Sometimes it is even of advantage to allow the intermixing of the gases prior to the substrates even to the degree where the same inflow channel is used for both source materials, for instance when the pulses of starting materials tend to leave residues in the nitrogen pulse. Hereby the feed pulse from one of the inflow channels reacts in a CVD-like manner with these residues and the CVD film thus produced is formed prior to the substrate and cannot interfere with the deposition of an ALE film.

EXAMPLE

The following is an example of the dimensioning of the thin-film apparatus of the invention:

| | |
|---|---|
| Substrate size | 300 × 300 mm |
| Number of substrates | 10 |
| Number of reaction chambers | 5 |
| Average spacing between substrates | 10 mm |
| Total volume of reaction chambers | 300 × 300 × 10 × 5 mm = 4,500 cm$^3$ |
| Dimensions of inflow channels | 100 cm$^3$ |
| Total volume | 4600 cm$^3$, or approximately 4.6 l |

The pump capacity is selected as 600 m$^3$/h, i.e. 167 l/s. The time interval between the pulses is at least about 0.028 s.

When an even flow is desired, this can also be expressed by saying that the flow is of equal magnitude in all nozzles. Hereby one can start to examine the conditions under which equal flows are implemented. The following model which can be described by electric resistance networks can be drafted to illustrate the situation:

| Gas in A | -----$R_{s4}$ | -----$R_{s3}$ | -----$R_{s2}$ | -----$R_{s1}$-- |
|---|---|---|---|---|
| I | I | I | I | I |
| $R_{t5}$ | $R_{t4}$ | $R_{t3}$ | $R_{t2}$ | $R_{t1}$ |
| I | I | I | I | I |
| B5 | B4 | B3 | B2 | B1 |
| Gas out | | | | |

Legends:
A  feed point for gas
Bn  gas outlet points
$R_{sn}$  flow resistance of inflow channel section
$R_{tn}$  flow resistance of flow throttle When an equal flow is desired for all flow slits B1 to B5, the magnitudes of the resistances in the resistance network formed by the flow resistances in question must be resolved as in the case of "real" electric resistance networks.

One way of solving the problem is to set out to calculate other resistors by furnishing suitable values for the resistors $R_{s1}$ and $R_{r1}$. As the flow is divided between two alternative flow paths in proportion to their flow resistances, B2 can be controlled such that it is equal to B1 by defining $R_{r1}$ such that it is equal to the sum of $R_{s1}$ and $R_{r1}$. Correspondingly, the value of $R_{r3}$ is determined such that it is half of what passes through $R_{r2}$ to B2 and B3. The mathematics of the solution becomes complicated as the number of inflow slits increases.

Another alternative is to calculate the pressure losses caused by the flows.

In this alternative the pressure at the feed of $R_{r2}$ is calculated when a certain flow travels to the substrate through $R_{r1}$ and $R_{s1}$. Assuming that the pressure at the points B1 to B5 (front edge of the substrate) is essentially constant, the value of $R_{r2}$ can be solved such that the flow traversing it is equal to the flow to B1. Next, the pressure increase over the flow resistance $R_{s2}$ required by the total flow volume is calculated. The pressure obtained is used to calculate the value of $R_{r3}$ as was done for $R_{r2}$. This is then repeated for all slits.

If the values of $R_{sn}$ were zero, the special situation would correspond to a case where the total conductance of the slits was much smaller than the conductance of the feeder pipe. In a real situation there is always some resistance and its influence must be taken into account. As the flow volume is different in different parts of the feeder pipe it is of advantage to reduce its cross-section as the flow is reduced when propagating further away from the feed. Hereby one can also make sure that the gas velocity remains essentially constant or is even accelerated before the last inflow slit. This provides improved cleansing of the pipe, i.e. faster operation of the reactor.

The manner of distributing the flow is independent of the pressure used but the method has been tested at a pressure of 1 to 50 mbar.

The method can also be used for stabilizing the exhaust suction.

The throttles may be slits, holes or pipes, for instance. In the case of parallel slits they may also be combined whereby a continuous slit of varying length or height is formed.

As the presupposition in the method is that the molecules have no mass, in practice the flow distribution changes due to the effect of the mass of the molecules and their velocity. Also the inaccuracy of the formulae and the production tolerances contribute to this distortion. This is why the piping undergoes the following trimming:

A mean runoff in accordance with the weighed average is measured from the substrate. Each flow throttle is compared thereto and is made larger or smaller, correspondingly. By repeating this procedure several times a highly even flow is accomplished. Often one correction is sufficient.

By means of the method it is possible to design the flow and the piping such that it is so close to correctness that is very easy to trim to correctness. Simultaneously flows traveling at even velocities are obtained. A flow piping providing an even distribution can even be constructed such that it has a low flow resistance and is fast.

The method has even been applied to provide planar flows. Hereby feeder pipes are arranged after the flow slits, the flow distribution being carried out in a corresponding manner for the pipes.

The method could possibly also be applied to planar flow distribution using one wide feeder slit.

In accordance with FIGS. 11 and 12, for the case of processing silicon wafers 30 having a circular shape, the distance D between inflow slits 31 and the inflow edge of the wafer 30 is adapted to be a constant value. In other words, the form of the inflow slit 31 arrangement is arranged to adopt the form of the wafer to be processed. Therefore, in this case the inflow slit 31 arrangement has the form of an arc, whereby the flowing distance from an inflow slit to the inflow edge 35 of the wafer 30 is the same for the complete inflow edge 35. This arrangement makes it easy to have uniform flow in the chamber 34.

FIG. 12 shows in cross sectional view one inflow element in accordance with the invention. In contrast to the embodiments of FIGS. 2–7 where the inflow structure is made of planar structures essentially perpendicular to the direction of the gas flow, in this embodiment it is preferable to form the inflow slot structure 31 of plates positioned parallel to the direction of the flow and the substrate.

What is claimed is:

1. An apparatus for growing thin films on a substrate by exposing the substrate to alternate surface reactions of vapor-phase reactants for forming a thin film on the substrate by means of the surface reactions, the apparatus comprising:

a reaction chamber having a first end and a second end;

a substrate pack positioned within the reaction chamber between the first end and the second end, the substrate pack having a plurality of substrate holders configured to hold a plurality of substrates, the substrate pack defining a plurality of flow paths between the substrate holders, each of said flow paths having a longitudinal axis that extends generally parallel to the major surfaces of the plurality of substrates;

a first reactant inflow piping and a second reactant inflow piping; and at least one outlet passage in communication with the flow paths for removing gaseous reaction products and excess reactants, wherein the first reactant inflow piping comprises at least one main channel, the main channel branching into at least two inflow branch channels that have longitudinal axes that extend generally perpendicular to said longitudinal axes of the flow paths, the branch channels terminating in a plurality of discharge orifices, the second reactant inflow piping comprising at least one main channel that branches into at least two inflow branch channels that have longitudinal axes that extend generally perpendicular to said longitudinal axes of the flow paths and between at least two inflow branch channels for the first reactant inflow piping, the branch channels for the second reactant inflow piping terminating in a plurality of discharge orifices;

wherein the discharge orifices for both the first reactant and the second reactant inflow pipings are formed, at least in part, in a first plate that lies substantially in a first plane that is generally perpendicular to said longitudinal axes of the flow paths; and wherein the branches for the first reactant and the second reactant are located between the main channels for the first reactant and the second reactant inflow pipings.

2. An apparatus as defined in claim 1, further comprising a second plate that is coupled to the first plate, wherein said second plate forms, at least in part, the branch channels of the first and second reactants inflow pipings.

3. An apparatus as defined in claim 2, further comprising a third plate, which forms at least in part the main channel of the first and second reactants inflow pipings and a suction groove in at least one of the first, second or third plates, whereby a pressure is generated in the groove that is higher or lower than the pressure in the reaction chamber.

4. An apparatus as defined in claim 3, further comprising a source of carrier gas connected to the suction groove.

5. An apparatus as defined in claim 1, wherein the plurality of substrate holders support the substrates in a V-shaped or inverted V-shaped position.

6. An apparatus as defined in claim 5, wherein the substrate holders supports the substrates at an angle of 1 to 10° relative to an adjacent substrate.

7. An apparatus as defined in claim 5, wherein the substrate holder supports the substrate at an angle of about 2°, relative to an adjacent substrate.

8. An apparatus as defined in claim 1, wherein the substrate holders and substrate pack are designed so that the substrate holders can be removed from the reaction space one by one or the substrate pack comprising a plurality of substrate holders can be removed as a whole.

9. An apparatus as defined in claim 1, wherein the plurality of substrate holders support the substrates such that the space between adjacent substrates define a tapered space.

10. An apparatus as defined in claim 9, wherein the tapered space tapers to a smaller cross-section in a downstream dimension.

11. An apparatus as defined in claim 9, wherein the tapered space tapers to a larger cross-section in a downstream dimension.

12. An apparatus as defined in claim 1, wherein the first and second reactants are kept separate until the first and second reactants enter the reaction chamber through the discharge orifices inflow pipings.

* * * * *